(12) United States Patent
Chang et al.

(10) Patent No.: US 7,011,933 B2
(45) Date of Patent: Mar. 14, 2006

(54) METHOD FOR MANUFACTURING MICRO-OPTICAL MIRROR ARRAYS

(75) Inventors: Ming-Chih Chang, Sinyuan (TW); Hua-Shu Wu, Hsinchu (TW); Tsong-Mu Lai, Thubei (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 356 days.

(21) Appl. No.: 10/636,981

(22) Filed: Aug. 7, 2003

(65) Prior Publication Data
US 2005/0031997 A1    Feb. 10, 2005

(51) Int. Cl.
*G02B 5/10* (2006.01)

(52) U.S. Cl. .............. 430/321; 430/322; 430/323; 430/324; 430/330

(58) Field of Classification Search .............. None
See application file for complete search history.

(56) References Cited

U.S. PATENT DOCUMENTS 5,245,454 A * 9/1993 Blonder ............... 349/113
6,335,150 B1 * 1/2002 Tsai .................... 430/321

FOREIGN PATENT DOCUMENTS

JP    2002-350841 A  * 12/2002

* cited by examiner

*Primary Examiner*—John A. McPherson
(74) *Attorney, Agent, or Firm*—Tung & Assoc.

(57) ABSTRACT

A method for producing a spheroidal shaped micro-array assembly including providing a substrate having frontside patterned openings formed in the substrate; blanket depositing a photosensitive layer over the substrate including the frontside patterned openings; exposing the photosensitive layer to ionizing radiation for a predetermined period of time to produce outgassing to separate the photosensitive layer and substrate to produce a spheroidal shaped photosensitive layer portion; blanket depositing a mirror layer over the photoresist layer to preserve the spheroidal shaped photosensitive layer portion; and removing the photosensitive layer.

32 Claims, 2 Drawing Sheets ved with respect to a conducting substrate by an electric field formed between the mirror and the surface of the conducting substrate. In other approaches magnetic materials and magnetic fields are used to move the mirrors.
METHOD FOR MANUFACTURING MICRO-OPTICAL MIRROR ARRAYS

FIELD OF THE INVENTION

This invention generally relates to manufacturing micro structural components and more particularly a method of for manufacturing micro-optical mirror array assemblies according to photoresist patterning and development method for achieving convex or concave micro-structural features.

BACKGROUND OF THE INVENTION

Micro-electromechanical system (MEMS) mirrors (or micro-optical mirrors) are essential to integration of optical and electronic systems including scanners, optical switches, and display systems. The micro-optical mirror structure generally includes moveable mirrors fabricated by microelectronic processing techniques on wafer substrates including glass and semiconducting substrates using techniques that are similar to manufacturing techniques for manufacturing integrated circuits. For example, a moveable micromirror includes a mirror and support structure suspended over a conducting substrate. In one approach, the mirror is moved with respect to a conducting substrate by an electric field formed between the mirror and the surface of the conducting substrate. In other approaches magnetic materials and magnetic fields are used to move the mirrors.

Generally, prior art fabrication methods have included forming a conductive mirror support in contact with integrated circuitry formed in a semiconducting substrate to control the application of electric or magnetic fields to move a mirror attached to the mirror support. Generally, two methods have been used in the prior art for forming a conductive mirror support and an overlying mirror assembly. One method includes patterned etching of a layer of conductive material formed over the semiconducting substrate to form the conductive mirror support. Another method includes forming a dielectric insulating layer over a layer of conductive material overlying the semiconducting substrate and etching patterned openings in the dielectric insulating layer to electrically communicate with a conductive layer the openings corresponding to a width or diameter dimension of the conductive mirror support. A metal layer is then selectively deposited to fill the openings and to extend above the level of the dielectric insulating layer to form a conductive mirror support member.

Mirror assemblies, according to the prior art have generally been created by etching a convex or concave pattern in a separate thin semiconducting substrate to form an array of mirrors which is then attached by bonding the mirror array over a substrate including the support members. Various patterning processes have be proposed including ion implantation from one side of a silicon substrate surface to produce an etch stop followed by etching both sides of the silicon substrate to form the mirror array assembly. The mirror surface is typically optimized for a particular application by selective metal deposition including chemical vapor deposition or electrodeposition processes. Another approach is to pattern and etch in a separate thin semiconducting substrate, for example polycrystalline silicon both the mirror support member and the mirror and bonding the substrate to a base substrate including integrated circuitry for producing electric or magnetic fields.

One problem with prior art processes is the numerous patterning and etching steps required to form a mirror assembly, also referred to as a MEMS mirror or a DMD (digital micro-mirror device). Another problem is consistent production of radii of curvature for the mirror surfaces, prior art process frequently introducing aspherical portions that lead to image distortion due to local variations in etching processes, including reactive ion etch (RIE) processes. In addition, it is frequently necessary to subject the substrate and mirror components to elevated temperatures during the processing steps which further introduce thermal expansion mismatches which may lead to stress buildup on mirror surfaces, further degrading optical quality.

There is therefore a need in the micro-optical mirror fabrication art to develop a micro-optical mirror fabrication method whereby a mirror surface may be produced with fewer processing steps to provide a more consistent radii of curvature.

It is therefore an object of the invention to provide a micro-optical mirror fabrication method whereby a mirror surface may be produced with fewer processing steps to provide a more consistent radii of curvature while overcoming other shortcomings of the prior art.

SUMMARY OF THE INVENTION

To achieve the foregoing and other objects, and in accordance with the purposes of the present invention, as embodied and broadly described herein, the present invention provides a method for producing a spheroidal shaped microarray assembly.

In one embodiment of the invention, the method includes providing a substrate having frontside patterned openings formed in the substrate; blanket depositing a photosensitive layer over the substrate including the frontside patterned openings; exposing the photosensitive layer to ionizing radiation for a predetermined period of time to produce outgassing to separate the photosensitive layer and substrate to produce a spheroidal shaped photosensitive layer portion; blanket depositing a mirror layer over the photoresist layer to preserve the spheroidal shaped photosensitive layer portion; and, removing the photosensitive layer.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Figure 1A:
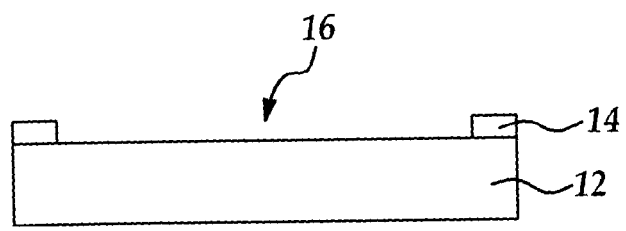
FIGS. 1A–1F are cross sectional side views of a portion of a micro-optical mirror array at stages of manufacture according to an implementation of the present invention.

Although the method of the present invention is advantageously used for manufacturing micro-optical mirrors it will be appreciated that the method of the present invention may be advantageously applied to any micro-electromechanical (MEM) fabrication process where the formation of a plurality of spheroidal surfaces with consistent radii of curvature is desired.

In a first embodiment of the invention, a substrate is provided having patterned openings formed in the substrate. A photosensitive layer such as photoresist is blanket deposited over the substrate including the patterned openings. The photosensitive layer is then subjected to ionizing radiation to produce outgassing where at least a portion of the gas effluent is trapped beneath the photosensitive layer to produce a curved surface, for example, having a positive radius of curvature with respect to the substrate surface over each of the patterned openings.

In one embodiment, the ionizing radiation is ultraviolet (UV) radiation. Preferably, for convenience of ionizing radiation sources available, the wavelength is in the ultraviolet light range from about 248 nm to about 400 nm, more preferably less than about 320 nm. It will be appreciated that the UV irradiation may include a variable bandwidth of wavelengths. In addition, exposure to deep ultraviolet (DUV) radiation (190–300 nm) is suitably useful. Convenient UV sources are high pressure xenon or mercury-xenon arc lamps fitted with appropriate optical filters to select the desired wavelengths for exposing the photosensitive layer.

It will be appreciated that the UV radiation exposure process may use other UV radiation sources such as a multi-photon process initiated by a high intensity source of ionizing radiation such as a laser for a controlled period of illumination to produce outgassing and deformation of the photosensitive layer while avoiding bursting or breaking the photosensitive layer. For example, an argon ion laser operating in the UV mode at several wavelengths near 350 nm is desirable. Also, a frequency-doubled argon ion laser with output near 257 nm wavelength is highly desirable.

In another embodiment, short wavelength coherent ionizing radiation is useful for the practice of this invention. For example, x-ray, electron beams or ion beam excitation may be suitably utilized. In this embodiment, the photoresist layer of photoresist over the patterned substrate is optionally disposed in a variable pressure environment, for example from about $10^{-6}$ Torr to about 100 Torr to controllably vary the rate of outgassing from the photoresist upon exposure to ionizing radiation. It will be appreciated that the ambient pressure may be varied during the photosensitive layer curing process (exposure to ionizing radiation) for all forms of ionizing radiation to control an outgassing rate of the photosensitive layer and to thereby control a rate of photosensitive layer deformation to produce a spheroidal shaped (e.g., convex or concave) photoresist layer portion.

In one embodiment, a photosensitive layer baking (heating) step is carried out simultaneously during at least a portion of the ionizing irradiation step. For example, the photosensitive layer baking step accelerates polymeric cross-linking reaction in the photosensitive layer, for example photoresist, to stabilize the photosensitive layer. Additionally, depending on the temperature, the photosensitive layer may initially be softened to enhance the deformation produced by outgassing during the ionizing irradiation step. Thus, the heating temperature may be controllably altered to achieve selective deformation of the photosensitive layer, for example, producing a spheroidal shaped portion with a predetermined radius of curvature. The application of both UV irradiation according to one aspect of the invention is believed to form a hardened shell in at least in the upper portion of a photoresist layer where UV light penetrates at least an upper portion of the photoresist layer during and following photoresist layer deformation to promote photoresist cross-linking reactions to stabilize the spheroidal shape produced by photoresist outgassing. In operation, depending on the chemical makeup of the photosensitive layer, upon exposure of the photosensitive layer to heat and/or light, chemical reactions are promoted that result in the release of gas from the photosensitive layer which are trapped, at least in part underneath and within the photosensitive layer and which upon achieving a pressure greater than the ambient tends to displace the photosensitive layer upward and away from and underlying material layer, for example silicon.

For example, the application of the baking step may be delayed for a predetermined period of time after beginning the ionizing radiation, for example UV radiation, to first form a hardened surface shell portion of the photosensitive layer prior to substantial deformation caused by outgassing. Application of heat to the photosensitive layer in the baking step simultaneous with continued UV exposure promotes additional cross-linking reactions within the photosensitive layer allowing a degree of control over the extent of deformation and therefore the final radius of curvature of a spheroidal shaped portion of the deformed photosensitive layer. Depending on the heating temperature, and the thickness of the photoresist layer, the thermal curing process may also accelerate the production of gas, while the UV radiation initiates polymer cross-linking reactions primarily limited to the exposed surface portions of the photosensitive layer acts to stabilize the exposed surface portions to slow the rate of escape of generated gas and to strengthen an upper shell of the photoresist layer to prevent bursting of the photoresist layer. Thus, selective control of both the rate of outgassing together with the strength or deformability of the photosensitive layer by selected application of both ionizing radiation, for example UV radiation, and heat to the photoresist layer allow control over the final radius of curvature of a deformed portion (e.g., spheroidal shaped portion) of the photosensitive layer. For example, the application of the UV radiation may be delayed for a predetermined period following application of heat to the photoresist surface to vary a radius of curvature of the curved (spheroid) portion of the photosensitive layer. For example, the application of heat to a photoresist layer above a temperature of about 150° C. may lead to an initial softening or flowability of the photoresist layer together with photoresist outgassing thus enhancing the extent of deformation of the photoresist layer while applying UV radiation forms a hardened shell at the surface portion of the photoresist layer where the major portion of the UV radiation is absorbed to stabilize the deformed photoresist layer portion. By altering various processing variables including radiation intensity, temperature, and ambient pressure, including the relative order of application or variation thereof, a radius of curvature of produced spheroidal portions of the photoresist layer over the patterned openings may be controllably varied.

It will be appreciated that the radius of curvature of the deformed photosensitive layer surface portions may be dependent on a variety of factors including the photosensitive layer material, the thickness of the photosensitive layer, the width and depth of the patterned openings, the wavelength and intensity of irradiation, and the ambient pressure. It will be appreciated that any or all of these variables may be altered to produce a selected radius of curvature of the deformed portion of the photosensitive layer.

Various photosensitive materials may be suitably used with the method of the present invention, although some may be preferable to others. For example with respect to conventional photoresists, for example, diazonapthoquinone (DNQ)/Novolac photoresists, irradiation with UV radiation having a wavelength of less than about 320 nm effectively promotes cross-linking. In addition, photoresists strongly absorb UV radiation and therefore limit the UV absorption to an upper portion (shell) of the photoresist layer. Alternatively chemically amplified DUV photoresists, including positive photoresists, also strongly absorb UV light at DUV wavelengths, for example less than about 300 nm, and promote cross-linking and to form a hardened or stabilized photoresist layer surface portion which is stabilized against flowing at higher temperatures, for example less than about 250° C. Photosensitive layers including ethyl lactate and n-Butyl acetate are preferred since outgassing deformation can be readily controlled. For example, UV radiation applied to a photoresist layer at an intensity of about 50 to about 200 mJ/cm$^2$, more preferably about 100 mJ/cm$^2$ is suitably used to induce photoresist cross-linking as well as photoresist outgassing. Different photoresist materials may have different rates of photoresist cross-linking and photoresist outgassing under given irradiation and heating conditions making selection of the photoresist material a variable factor in achieving a controlled radius of curvature of a spheroidal portion of a photoresist layer.

Referring to FIGS. 1A–1F is shown an exemplary implementation of the method of the present invention for producing a micro-optical mirror assembly. Shown are cross sectional side views of a portions of a substrate at stages in fabrication of an exemplary micro-optical mirror assembly portion. Referring to FIG. 1A, is shown a semiconducting substrate 12, for example, silicon and an overlying layer of a dielectric insulating material 14, for example silicon dioxide (SiO$_2$) or other commonly used dielectric insulating layer such as silicon nitride (e.g., Si$_3$N$_4$). An opening 16 (frontside opening) is etched in the dielectric insulating layer 14 to expose the silicon substrate 12. For example, a reactive ion etching (RIE) process following a conventional photolithographic patterning step may be used or a wet etching process used to form the opening 16. It will be appreciated that the thickness of the dielectric insulating layer 14 may vary depending on the size of the mirrors desired to be produced. For example the thickness of the dielectric insulating is preferably about 5000 Angstroms thick to about 100,000 Angstroms thick. For example mirror elements may be created with diameter of about 10 microns to about 1 millimeter depending on the application and the desired resonant frequency for resonant frequency devices. It is desirable that the dielectric insulating layer be about ¼ to about ¾ the thickness of the subsequently deposited photoresist layer to provide an adequate anchoring support for the photoresist layer upon deformation to produce a spheroidal (curved) surface.

Figure 1B:
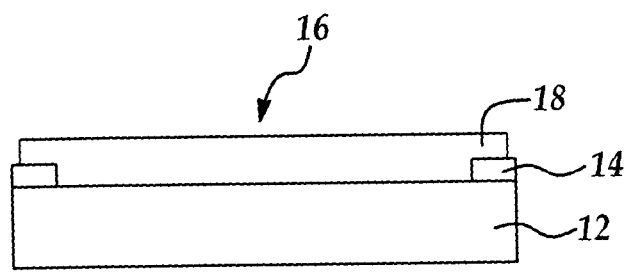

Referring to FIG. 1B, a layer 18 of photoresist is blanket deposited, for example by a conventional spin coating process over the dielectric insulating layer to include being deposited over the opening. It will be appreciated that the thickness of the photoresist layer will vary depending on the desired radii of curvature desired and the diameter of the mirror element which roughly corresponds to the opening width. For example, the thickness of the photoresist layer should be about 1/100 to about 1/10 of the opening width to provide sufficient gas generation for photoresist deformation while allowing formation of a stable photoresist surface without bursting following photoresist curing to achieve, for example, a spheroidal surface approaching a radius of curvature of a sphere. It will be appreciated that the thickness of the photoresist layer may be altered to vary a radius of curvature, however, preferably the photoresist layer is sufficiently thick to provide both sufficient gas generation for surface deformation and sufficiently thick to provide a stable deformed photoresist layer following UV radiation exposure with optional heating. For example, the photoresist layer thickness may typically range from about 3000 Angstroms to about 50,000 Angstroms. Following deposition of the photoresist layer 18, the photoresist layer is preferably patterned to expose the dielectric insulating layer 14 and produce photoresist layer portions overlying the frontside openings 16. Several commercially available photoresists may be used including DUV photoresists and diazonapthoquinone (DNQ)/Novolac photoresists.

Figure 1C:
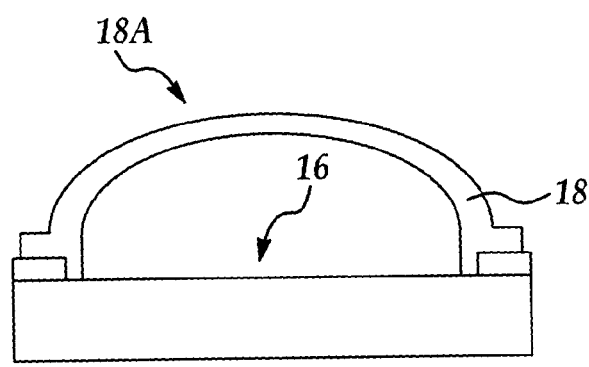

Referring to FIG. 1C, in an exemplary implementation of the invention, the photoresist is subjected to substantially simultaneous application of UV irradiation and heat. For example, the UV irradiation is supplied by a mercury-xenon lamp at about 300 Watts and optionally including a filter for limiting wavelength exposure less than about 350 nm, for example between about 100 nm and about 350 nm, while simultaneously heating the photoresist layer at an ambient pressure of about 1 atmosphere at a temperature up to about 150° C. to about 250° C. The heat may be separately supplied by a furnace or resistively heated support plate. Optionally, the photoresist temperature may be ramped up to temperature at about 2° C./min to about 5° C./min while simultaneously irradiating the photoresist. The application of both UV radiation and heat is preferably maintained at about 150° C. to about 250° C. for about 10 minutes to about 60 minutes.

Following the photoresist curing treatment according to preferred embodiments, a spheroidal shaped photoresist surface portion 18A is produced being anchored to the dielectric insulting layer 14 sidewall portions. Preferably the photoresist curing treatment is carried out for a sufficient period of time to sufficiently stabilize the photoresist against flow during subsequent steps where the photoresist temperature may be about 150° C. to about 250° C.

Figure 1D:
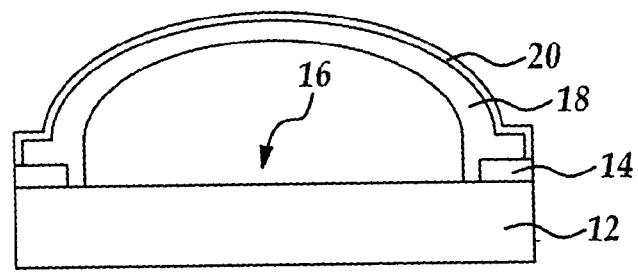

Referring to FIG. 1D, following formation of the spheroidal shaped photoresist portion, a deposition process is carried out to deposit reflective layer 20 over the photoresist layer. For example, the reflective layer may include a metal layer deposited at a temperature lower than the softening point of the cured photoresist layer, for example about 200° C. For example, a low temperature aluminum CVD process using organo-metallic precursors such as trimethyl aluminum (TMA) and dimethyl aluminum hydride (DMAH) in an LPCVD process. Alternatively a PVD process may be used where the deposition rate is controlled to keep the heating of the photoresist layer below a softening point. Another approach is to deposit a seed layer of PVD aluminum or copper followed by an electrochemical plating (ECP) process to deposit a copper layer over the seed layer. The thickness of the reflective layer will depend on the desired stiffness including resonant frequency of the mirror component. For example an aluminum or copper film is preferably deposited to a thickness of about 500 Angstroms to about 10000 Angstroms. In one embodiment, the reflective layer 20 is blanket deposited over a patterned photoresist layer where a portion of the dielectric insulating layer 14 has been exposed such that the reflective layer 20 covers and is anchored to a portion of the dielectric insulating layer. It will be appreciated that alternating layers of relatively high index of refraction and relatively low index of refraction material may be deposited in multiple layers to form a reflective surface. For example following formation of a support layer of metal, multiple layers of dielectric material with alternating indexes of refraction may be deposited at temperatures higher than 200° C. to form a multiple layers of for example, quarter wavelength (wavelength desired for maximum reflection) thickness dielectric layers of alternating layers of variable index of refraction material, for example SiO$_2$ and TiO$_2$.

Figure 1E:
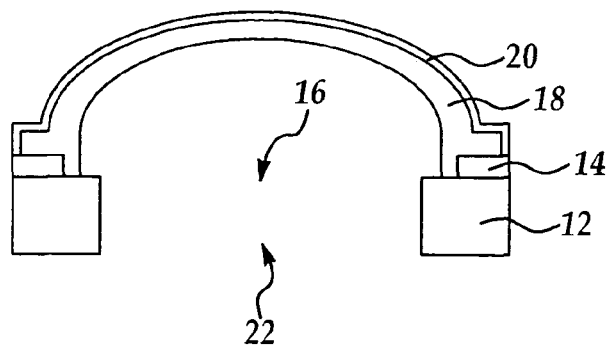

Referring to FIG. 1E, following deposition of the reflective layer 20, the silicon substrate is etched from the backside following a conventional photolithographic patterning process to selectively etch through the thickness of the silicon substrate 12 to form a backside opening 22 in the silicon substrate 12 to communicate with the frontside opening 16. Preferably, the spheroidal photoresist portion encompasses the backside opening 22 formed in the silicon substrate, the backside opening 22 about the same width or slightly less than the frontside etched opening width 16.

Figure 1F:
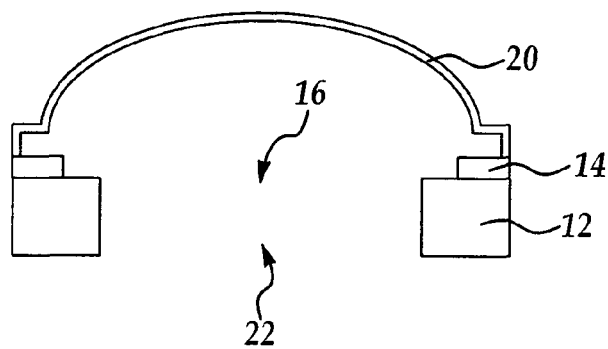

Referring to FIG. 1F, following etching through the backside of the silicon substrate, the photoresist layer is removed to leave a self supporting reflective layer 20 to form a micro-optical mirror array assembly. For example a conventional oxygen ashing process may be used alone or in addition to a conventional subsequent wet stripping process as is known in the art of integrated circuit manufacturing. Subsequent processes known in the art for forming an integrated micro-optical mirror assembly may then be carried out to complete the micro-optical mirror array assembly.

Figure 2:
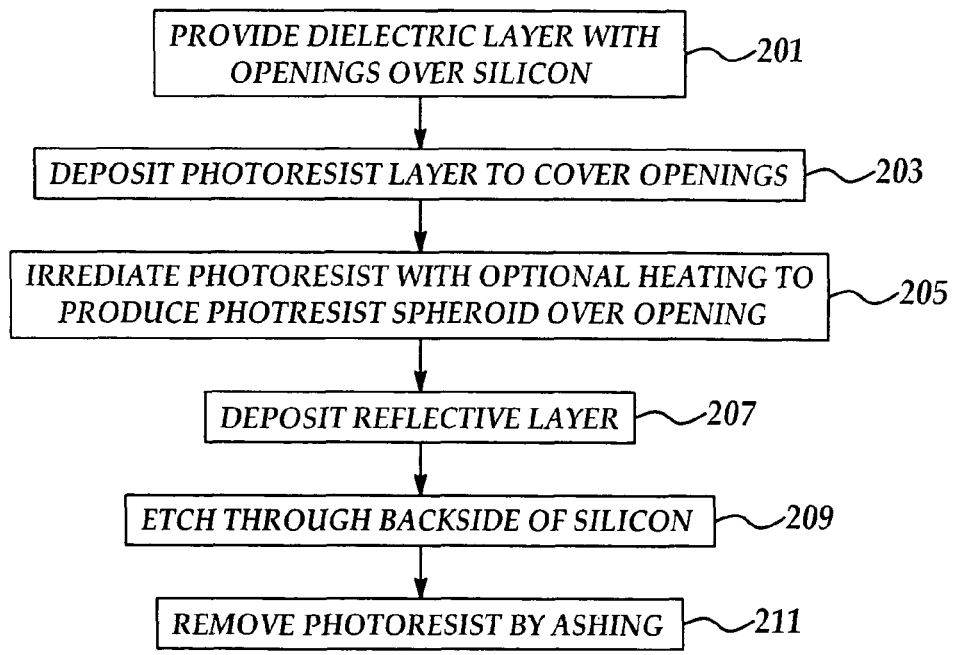
FIG. 2 is a process flow diagram including several embodiments of the present invention.

Referring to FIG. 2 is a process flow diagram including several embodiments of the method of the present invention. In process 201, a silicon substrate is provided with an overlying dielectric insulating layer patterned with etched openings exposing the silicon substrate. In process 203, a photoresist layer is blanket deposited over the dielectric insulating layer and patterned to cover the etched openings. In process 205, the photoresist is cured according to preferred embodiments including ionizing radiation, for example UV radiation, and optionally simultaneously heating the photoresist layer during at least a portion of the UV irradiation to produce spheroidal shaped photoresist portions each disposed over a respective etched opening and having a predetermined radius of curvature. In process 207, one or more reflective layers, for example metal, are deposited over the photoresist layer including exposed dielectric layer portions. In process 209, the silicon substrate is etched from the substrate backside surface (not including the photoresist layer) to etch through the thickness of the silicon substrate to form an opening in the substrate exposing at least a portion of and encompassed by the spheroidal shaped photoresist portions. In process 211, the photoresist layer is removed.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for producing a spheroidal shaped micro-array assembly comprising the steps of:
   providing a substrate comprising at least one frontside patterned opening formed in the substrate;
   blanket depositing a photosensitive layer over the substrate including the at least one frontside patterned opening; and
   exposing the photosensitive layer to ionizing radiation for a predetermined period of time to produce photosensitive layer outgassing where at least a portion of effluent gas is trapped beneath the photosensitive layer to produce a spheroidal shaped photoresist layer portion over the at least one frontside patterned opening.

2. The method of claim 1, further comprising the step of blanket depositing a mirror layer to preserve the spheroidal shaped photosensitive layer portion.

3. The method of claim 2, wherein the mirror layer comprises at least one layer selected from the group consisting of a metal and a dielectric.

4. The method of claim 1, further comprising the step of removing the spheroidal shaped photosensitive layer portion.

5. The method of claim 4, wherein the step of removing the spheroidal shaped photosensitive layer portion further comprises etching backside openings through the thickness of the backside of the substrate each said backside opening communicating with and encompassed by the spheroidal shaped photosensitive layer portion.

6. The method of claim 5, further comprising performing at least one of an oxygen ashing process and a wet etching process to remove the spheroidal shaped photosensitive layer portion.

7. The method of claim 1, wherein the ionizing radiation comprises ultraviolet (UV) radiation.

8. The method of claim 7, wherein the photosensitive layer comprises a photoresist layer.

9. The method of claim 8, wherein the photoresist layer comprises ethyl lactate and n-Butyl acetate.

10. The method of claim 8, wherein the UV radiation penetrates an upper surface portion of the photoresist layer to accelerate photoresist cross-linking in an upper surface portion.

11. The method of claim 7, wherein UV radiation intensity is applied at an intensity of about 50 to about 200 $mJ/cm^2$.

12. The method of claim 7, wherein the UV radiation is comprises wavelengths between about 100 and about 350 nm.

13. The method of claim 1, wherein the step of exposing includes simultaneously heating the photosensitive layer during at least a portion of the predetermined period of time.

14. The method of claim 13, wherein heating the photosensitive layer comprises maintaining a temperature between about 150 degrees Centigrade to about 250 degrees Centigrade.

15. The method of claim 13, wherein at least one of an ionizing radiation intensity, a photosensitive layer heating profile, and an ambient pressure is varied to alter a radius of curvature of the spheroidal shaped photosensitive layer portion.

16. The method of claim 13, wherein said UV radiation is produced by a radiation source comprising wavelengths of less than about 350 nm.

17. The method of claim 1, wherein the photosensitive layer thickness is varied to alter a radius of curvature of the spheroidal shaped photosensitive layer portion.

18. A method for producing a micro-optical mirror assembly component comprising the steps of:
   providing a silicon-based substrate comprising an overlying dielectric insulating layer having frontside etched openings exposing the silicon substrate;
   blanket depositing a photoresist layer over said substrate including said frontside etched openings;
   exposing said photoresist layer to ultraviolet (UV) radiation for a predetermined period of time to produce photoresist generated gas where at least a portion of said gas is trapped beneath said photoresist layer to displace said photoresist layer away from the silicon-based substrate to produce a spheroidal shaped photoresist layer portion over the frontside etched openings;
   blanket depositing at least one layer selected from the group consisting of a metal and a dielectric layer over said photoresist layer to form a reflective surface;
   etching backside openings through said silicon substrate thickness from the backside of said silicon substrate each of said backside openings encompassed by said spheroidal shaped photoresist layer portion; and
   removing said photoresist layer.

19. The method of claim 18, wherein the step of removing comprises performing at least one of an oxygen ashing process and a wet etching process.

20. The method of claim 18, wherein the step of exposing includes simultaneously exposing said photoresist layer to a thermal treatment process for at least a portion of the predetermined period of time.

21. The method of claim 20, wherein said thermal treatment process comprises a temperature of about 150 degrees Centigrade to about 250 degrees Centigrade for a period of about 10 minutes to about 60 minutes.

22. The method of claim 20, wherein at least one of a UV radiation intensity, a thermal treatment temperature profile, and an ambient pressure is varied to alter a radius of curvature of said spheroidal shaped photoresist layer portion.

23. The method of claim 20, wherein said photoresist layer thickness is varied to alter a radius of curvature of said spheroidal shaped photoresist layer portion.

24. The method of claim 18, wherein said UV radiation and said photoresist layer is arranged to penetrate an upper portion of said photoresist layer to form a flow resistant upper portion.

25. A method for producing a spheroidal shaped microarray assembly comprising the steps of:
providing a substrate comprising at least one frontside patterned opening formed in the substrate;
blanket depositing a photosensitive layer over the substrate including the at least one frontside patterned opening; and
exposing the photosensitive layer to ionizing radiation for a predetermined period of time to separate the photosensitive layer from the substrate to produce a spheroidal shaped photosensitive layer portion.

26. The method of claim 25, further comprising the step of blanket depositing a mirror layer to preserve the spheroidal shaped photosensitive layer portion.

27. The method of claim 26, further comprising the step of removing the spheroidal shaped photosensitive layer portion.

28. The method of claim 27, wherein the step of removing the spheroidal shaped photosensitive layer portion further comprises etching backside openings through the thickness of the backside of the substrate each said backside opening communicating with and encompassed by the spheroidal shaped photosensitive layer portion.

29. The method of claim 28, wherein the ionizing radiation penetrates an upper surface portion of the photosensitive layer to accelerate cross-linking in an upper surface portion.

30. The method of claim 25, wherein the step of exposing includes simultaneously heating the photosensitive layer during at least a portion of the predetermined period of time.

31. The method of claim 30, wherein at least one of an ionizing radiation intensity, a photosensitive layer heating profile, and an ambient pressure is varied to alter a radius of curvature of the spheroidal shaped photosensitive layer portion.

32. The method of claim 25, wherein the photosensitive layer thickness is varied to alter a radius of curvature of the spheroidal shaped photosensitive layer portion.

* * * * *